United States Patent [19]

Mack et al.

[11] Patent Number: 4,736,271
[45] Date of Patent: Apr. 5, 1988

[54] PROTECTION DEVICE UTILIZING ONE OR MORE SUBSURFACE DIODES AND ASSOCIATED METHOD OF MANUFACTURE

[75] Inventors: William D. Mack, Cupertino; Richard H. Lane, San Jose, both of Calif.

[73] Assignee: Signetics Corporation, Sunnyvale, Calif.

[21] Appl. No.: 65,450

[22] Filed: Jun. 23, 1987

[51] Int. Cl.$^4$ .............................................. H02H 9/00
[52] U.S. Cl. ....................... 361/91; 361/100; 361/110; 307/200 B; 307/202.1; 307/304; 357/23.13; 357/42
[58] Field of Search ............... 361/88, 91, 100, 110; 307/200 B, 202, 304; 357/23.13, 42

[56] References Cited

U.S. PATENT DOCUMENTS

| | | | |
|---|---|---|---|
| 3,673,428 | 6/1972 | Athanas | 307/202 |
| 3,967,295 | 6/1976 | Stewart | 357/51 |
| 4,602,267 | 7/1986 | Shirato | 357/23.13 |
| 4,605,980 | 8/1986 | Hartranft et al. | 357/23.13 |
| 4,617,482 | 10/1986 | Matsuda | 361/91 |

OTHER PUBLICATIONS

Manzoni, "Electrostatic Discharge Protection in Linear ICs," *IEEE Trans. Cons. Elec.*, Aug. 1985, pp. 601–607.
Funk, "Susceptibility of Semiconductors to Electrostatic Damage," *Elec. Engrg.*, Mar. 1983, pp. 51–59.

*Primary Examiner*—A. D. Pellinen
*Assistant Examiner*—Jeffrey A. Gaffin
*Attorney, Agent, or Firm*—R. J. Meetin; J. Oisher; T. Briody

[57] ABSTRACT

A protection device (14) for an integrated circuit (12) created on a semiconductor body (24 and 26) utilizes one or more semiconductor diodes ($D_L$ and/or $D_H$) that have subsurface PN junctions (46 and/or 56) for preventing high-magnitude voltages, such as those generated by electrostatic discharge, from damaging sensitive electronic elements of a protected circuit component (16) formed from part of the body. The device is fabricated by an epitaxial layer/double buried region process.

26 Claims, 8 Drawing Sheets

PROTECTION DEVICE UTILIZING ONE OR MORE SUBSURFACE DIODES AND ASSOCIATED METHOD OF MANUFACTURE

FIELD OF USE

This invention relates to devices for preventing a voltage applied between terminals of a semiconductor integrated circuit (IC) fromdamaging a circuit component coupled to the terminals.

BACKGROUND ART

Electrostatic discharge (ESD) can damage an IC. Metal-oxide semiconductor (MOS) IC's are especially prone to ESD damage because their thin gate dielectrics rupture at moderate voltages. ESD is also a problem for bipolar IC's, though somewhat less than in the MOS case. The base-emitter junctions in bipolar IC's are most susceptible to ESD damage. As IC dimensions shrink, ESD becomes more of a concern for both bipolar and MOS IC's.

ESD occurs during IC aassembly, test, transfer, and installation. Static electricity generated by an individual handling an IC or by the action of the IC sliding down the rails of a shipping carrier or an automatic test device discharges across the IC. A person readily generates 1,000–10,000 volts of static electricity. The source resistance of the human body partially alleviates teh destructive effect of this high voltage. Nonetheless, the resulting voltage can be very damaging. The ESD produced when the IC slides down the shipping-carrier or test-equipment rails can be equally harmful. Consequently, a protection mechanism is usually incorporated into the IC to prevent ESD damage.

Various models are employed to evaluate sensitivity to ESD. Manzoni, "Electorstatic Discharge Protection in Linear ICs," *IEEE Trans. Cons. Elec.*, August 1985, pp. 601–607, discusses the principal models. Referring to FIG. 1, it illustrates one of these models. FIG. 1 shows hos a circuit 10 emulating the human body interacts wtih an IC 12 that contains a device 14 for protecting a circuit component 16.

A voltage $V_E$ that emulates the actual electrostatic voltage is applied through a two-pole switch 18 to a capacitor $C_{HB}$ in human body circuit 10. Capacitor $C_{HB}$ represents the human body capacitance of 100–200 picofarads. After capacitor $C_{HB}$ is charged to $V_E$, switch 18 is moved from its charging position to its discharging position. Capacitor $C_{HB}$ discharges through a resistor $R_{HB}$ representing the human body resistance of 1,000–2,000 ohms to produce a voltage $V_G$ relative to ground. Voltage $V_G$ is applied between two of the externally accessible terminals (or pins) of IC 12.

Turning to IC 12, it has supply terminals $T_L$ and $T_H$ that receive suitable supply voltages, referred to here as "$V_{LL}$" and "$V_{HH}$", during normal powered IC operation. $V_{HH}$ is greater than $V_{LL}$. Protected circuit component 16 is internally connected to terminals $T_L$ and $T_H$ to receive operating power from them.

IC 12 has a group of terminals for transferring information, such as digital data or analog signals, between component 16 and the external environment during normal powered IC operation. These terminals are referred to categorically as information terminals to differentiate them from terminals $T_L$ and $T_H$ and any other IC supply pins. The information transmitted through the information terminals may include reference signals that are not supply voltages. FIG. 1 shows one such information terminal $T_N$. Protection device 14, which is connected between terminal $T_N$ and component 16, has little effect on the information transmission as long as the voltage at terminal $T_N$ lies between the voltages at terminals $T_L$ nad $T_H$.

When ESD causes the voltage between any two of terminals $T_L$, $T_N$, $T_H$ to approach a magnitude that could damage component 16, device 14 becomes active and attempts to limit this voltage on a non-destructive level. Resistor $R_{HB}$ is part of the operational dynamics of the protective action because it damps the $V_E$ discharge from capacitor $C_{HB}$. FIG. 1 illustrates the specific situation in which voltage $V_G$ is applied between terminals $T_N$ and $T_L$.

Protection device 14 has been implemented in many ways in the prior art. FIG. 2 shows an implementation employing a pair of semiconductor diodes $D_A$ and $D_B$ connected in series between terminals $T_L$ and $T_H$. The $D_A$ cathode and the $D_B$ anode are coupled in common through a current-limiting resistor $R_P$ to terminal $T_N$. Device 14 may also include further voltage protection circuitry 20 connected to terminal $T_N$ and/or resistor $R_P$. See Manzoni mentioned above. Also see Funk, "Susceptibility of semiconducotrs to electrostatic damage," *Elec. Engrg.*, March 1983, pp. 51–59.

IC 12, including device 14 and component 16, is fabricated from a semiconductor body having an upper surface along whch the various circuit elements are located. In device 14 of FIG. 2, diodes $D_A$ and $D_B$ are conventionally formed as "surface" diodes. That is, the PN junction between the anode and cathode of each diode $D_A$ or $D_B$ l reaches the upper semiconductor surface. U.S. Pat. Nos. 3,673,428 and 3,967,295 describe examples of this construction.

Embodying diodes $D_A$ and $D_B$ as surface diodes is disadvantageous because the highest diode dopaant concentrations normally occur at the upper semiconductor surface. ESD currents flowing through the diode PN junctions thereby focus strongly at the upper semiconductor surface. Because the overlying dielectric material does not dissipate heat well, diodes $D_A$ and $D_B$ fail at undesirably low ESD voltages. This renders component 16 vulnerable to subsequent ESD pulses. The problem becomes worse as circuit dimensions shrink.

GENERAL DISCLOSURE OF THE INVENTION

In accordance with the invention, a protection device for an IC created on a semiconductor body employs one or more semiconductor diodes that have "subsurface" PN junctions for preventing high-magnitude voltages, such as those produced by ESD, from damaging sensitive electronic elements of a protected circuit component formed from art of the body. As used herein, "subsurface" means that these PN junctions lie below the upper semiconductor surface where the circuit elements are located. More precisely, the edges of junctions do not reach the upper surface of the semiconductor body. This key factor enables current flowing through the subsurface junctions to be distributed much more uniformly across the junctions than in the foregoing prior art protection device. The semiconductor body employed in the present device is thus much better able to sink the heat of an ESD pulse without damaging the protection device.

The IC hasa an information terminal coupled to the protected circuit component for transferring information between it and the external environment, a first supply terminal for receiving a first supply voltage, and a second supply terminal for receiving a second supply voltage greater than the first supply voltage. The supply terminals are coupled to the component.

The protection device usually contains a pair of "subsurface" diodes that function to prevent a voltage applied between any two of the terminals from reaching a level capable of damaging the protected component. One of the diodes has its anode and cathode respectively coupled to the first supply terminal and the information terminal. The other has its anode and cathode respectively coupled to the information terminal and the second supply terminal. Depending on the application, one or the other of the diodes may be omitted from the protection device.

The diodes are formed from part of the semiconductor body. A dielectric isolation mechanism, recessed into the body below the upper surface, laterally separates a group of active semiconductor portions of the body from one another along the upper surface. The anode and cathode of each diode respectively comprise a P-type zone and an N-type zone that extend from the upper surface down into a pair of the active portions to form a PN junction that lies entirely below the upper surface. At least one of the zones for each diode extends vertically through the active portion for that zone and into material of the body below the isolation mechanism. The entire perimeter of at least one of the PN junctions normally adjoins the isolation mechanism.

The protection device is preferably fabricated by a buried region/epitaxial layer process. The first step is to introduce N-type and P-type dopants into a semiconductor substrate, each dopant entering the substrate at two separate locations. An epitaxial layer is then grown on the substrate to form the semiconductor body. The isolation mechanism is created in the body, and two N-type and two P-type connection regions extending from the upper surface are suitably established in the active semiconductor portions for the diodes. The above-mentioned dopants diffuse further into the semiconductor body during at least the foregoing steps to form two N-type buried regions and two P-type buried regions that respectively meet the N-type buried regions to define the subsurface PN junctions for the diodes. Each buried region also ohmically meets a corresponding one of the connection regions.

The buried and connection regions are typically defined with a set of photoresist masks that are also used to define buried and connection regions elsewhere in the IC. The protection device can thus be manufactured without adding any steps to the overall IC fabrication process.

The protection device of the invention is simple and occupies a small die area. The subsurface diodes provide an extremely high level of ESD protection. At the standard values of 150 picofarads and 1,500 ohms for the human body capacitance and resistance, a single 4-mil$^2$ subsurface diode prevents 2,000 volts of ESD from damaging a small state-of-the-art base-emitter junction that would fail at 50–100 volts in the unprotected situation.

Prior art protection devices either furnish less protection or occupy more area at the same protection level. An embodiment of the above-mentioned prior art device that utilizes two surface diodes occupying 8 mil$^2$ would provide the foregoing base-emitter junction with only 500–1,000 volts of ESD protection. The equivalent embodiment of the present device achieves 3,000–4,000 volts of protection. A full double ring of subsurface diodes enables an IC containing this base-emitter junction to withstand 5,000 volts of ESD applied between any two pins in any polarity. Consequently, the invention provides a great advance over the prior art.

BRIEF DESCRIPTION OF THE DRAWINGS

Like reference symbols are employed in the drawings and in the description of the preferred embodiments to represent the same or very similar item or items.

DESCRIPTION OF THE PREFERRED EMBODIMENTS

Figure 3:
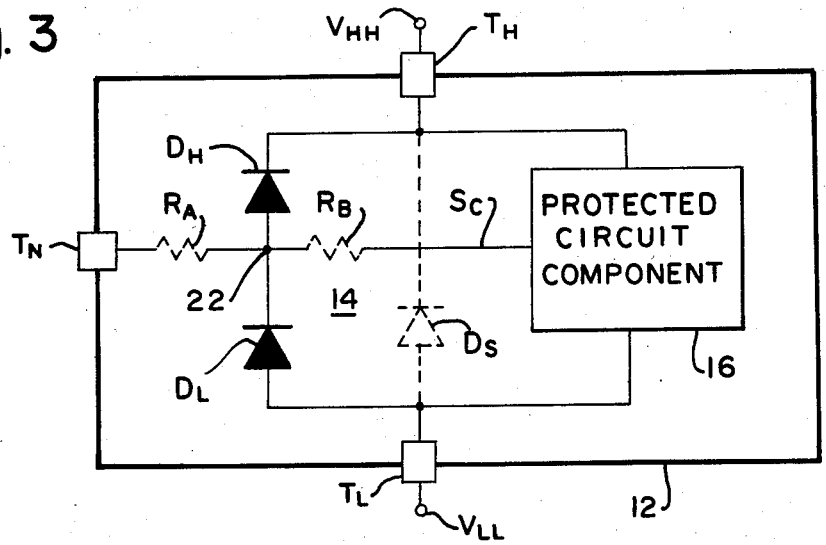
FIG. 3 is a circuit/block diagram of an IC that utilizes a protection device formed with subsurface diodes in accordance with the invention.

Referring to FIG. 3, it illustrates a general embodiment of protection device 14 in which semiconductor diodes having subsurface PN junctions are employed to protect circuit components 16 of IC 12 from being damaged by ESD or other high-voltage overloads. The present diodes are often referred to as "subsurface" diodes to distinguish them from the above-mentioned surface diodes whose PN junctions reach the upper semiconductor surface where the electronic elements of components 16 are located.

Device 14 of FIG. 3 contains subsurface dioded $D_L$ and $D_H$ and optional current-limiting resistors $R_A$ and $R_B$. The $D_L$ anode and cathode are respectively connected to supply terminal $T_L$ and a node 22. The $D_H$ anode and cathode are respectively connected to node 22 and supply terminal $T_H$. Information terminal $T_N$ is either connected directly to node 22 or via resistor $R_A$ if it is present. Node 22 is either connected directly to component 16 or via a resistor $R_B$ if it is used. Component 16 is also connected between terminals $T_L$ and $T_H$ which receive respective low and high supply voltages $V_{LL}$ and $V_{HH}$ during normal powered IC operation.

Device 14 may also include a subsurface diode $D_S$ that functions as a shunt between terminals $T_L$ and $T_H$ to prevent a voltage applied between them from reaching a level that could damage component 16. The $D_S$ anode and cathode are respectively connected to terminals $T_L$ and $T_H$. The other circuit elements in IC 12—i.e., the elements in component 16 along with those in device 14 excluding diode $D_S$—provide an inherent shunting capability between terminals $T_L$ and $T_H$. Diode $D_S$ is not necessary if this shunting capability is great enough.

Figure 4A:
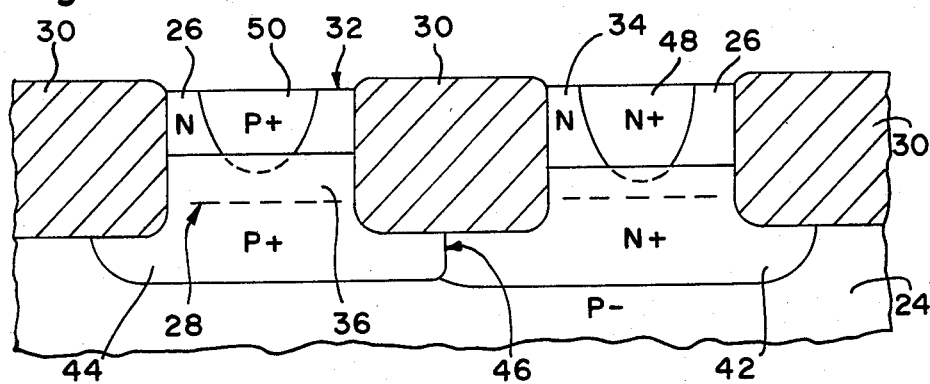
FIGS. 4a and 4b are cross-sectional side structural views of subsurface diodes employable in the device of FIG. 3.
Figure 4B:
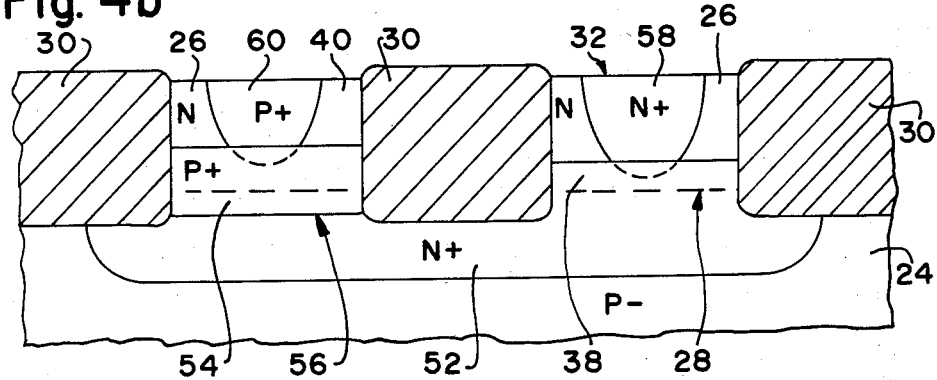

FIGS. 4a and 4b show two basic structures for implementing subsurface diodes $D_L$, $D_H$, and $D_S$. In both structures, the semiconductor body used to form IC 12 consists of a lightly doped P-type monocrystalline silicon substrate 24 and an N-type epitaxial silicon layer 26 lying on the upper surface 28 of substrate 24. The conductivity type of epitaxial layer 26 is not particularly material to the diodes of FIGS. 4a and 4b and could as well be P-type.

An electrical isolation mechanism 30 is recessed into the semiconductor body below the upper surface 32 of epitaxial layer 26 so as to laterally separate a group of active semiconnductor portions of the body from one another along upper surface 32. Four such active portions 34, 36, 38, and 40 are depicted in FIGS. 4a and 4b. The circuit elements of component 16 are formed in other active portions. Isolation mechanism 30 extends entirely through layer 26 and slightly into substrate 24. Mechanism 30 consists of a dielectric material such as silicon dioxide, at least where mechanism 30 adjoins the monocrystalline silicon of the semiconductor body.

Turning specifically to FIG. 4a, a heavily doped N-type buried region 42 and a heavily doped P-type buried region 44 lie generally along interface 28 below upper surface 32. N+ region 42 extends partly into active portion 34. P+ region 44 extends partly into active portion 36. Buried regions 42 and 44 meet below isolation mechanism 30 to form a subsurface PN junction 46. Lightly doped P-type material of substrate 24 thereby adjoins regions 42 and 44 along their lower surfaces.

A heavily doped N-type connection region 48 and a heavily doped P-type connection region 50 extend from upper surface 32 resepctively into active portions 34 and 36 down to buried regions 42 and 44. The cathode for the subsurface diode of FIG. 4a is the N-type zone formed by N+ regions 42 and 48. The anode is the P-type zone consisting of P+ regions 44 and 50.

Moving to FIG. 4b, heavily doped N-type and P-type buried regions 52 and 54 lie generally along interface 28 below upper surface 32. N+ region 52 extends partly into active portion 38. Region 52 also extends partly into active portion 40 in the example shown in FIG. 4b. P+ region 54 lies within portion 40 in the illustrated example and is fully bounded by the sidewalls of isolation mechanism 30. Alternatively, P+ region 54 could extend downward below the lower surface of mechanism 30. In either case, buried regions 52 and 54 meet to form a subsurface PN junction 56 whose entire perimter adjoins mechanism 30. Consequently, P-type material of substrate 24 fully surrounds N+ region 52 up to mechanism 30.

Heavily doped N-type and P-type connection regions 58 and 60 extend from upper surface 32 respectively into active portions 38 and 40 down to buried regions 52 and 54. The cathode for the substrate diode of FIG. 4b is the N-type zone consisting of N+ regions 52 and 58. The anode is the P-type zone formed by P+ regions 54 and 60.

Each of connection regions 48, 50, 58, and 60 usually extends to the sidewalls of isolation mechanism 30 even though not so illustrated in FIGS. 4a and 4b. While each of the anodes and cathodes in FIGS. 4a and 4b is shown as consisting of a pair of basically separate regions, each anode or cathode might consist of just a single heavily doped region.

The dopant concentrations in the silicon along both sides of junction 46 or 56 are relatively uniform. The curvature of junctions 46 and 56 is much less than that of a typical surface junction. Consequently, current flowing through junctions 46 and 56 is distributed quite uniformly across them.

The threshold voltage $V_T$ for each of the diodes in FIGS. 4a and 4b is 0.5-1 volt. The breakdown voltage $V_{BD}$ for both diodes is normally about 10 volts but can be tailored to meet specific applications. $V_{BD}$ is usually greater than the IC supply voltage $V_{HH}$-$V_{LL}$ so that diode $D_S$ (if present) isnot subject to breakdown during normal operation. Each subsurface diode typically hsa a series resistance of about 2.5 ohms in the forward bias direction and about 10 ohms in the reverse bias direction. The layout area for each of the diodes is typically 4 mil$^2$.

Diodes $D_L$ and $D_S$ of FIG. 3 can be implemented with the structure of FIG. 4a. P-type substrate 24 is usually connected to supply terminal $T_L$. Because buried P-type region 44 of the structure in FIG. 4a is also connected directly to substrate 24 (i.e., there is no interventing PN junction), the structure of FIG. 4a normally cannot be used for diode $D_H$. This disadvantage is offset by the fact that this structure has a lower capacitance than that of FIG. 4b. Diodes $D_L$, $D_H$, and $D_S$ can all be implemented with the structure of FIG. 4b.

The conductivity types could be reversed in FIGS. 4a and 4b. In this case, substrate 24 (now of N-type conductivity) is usually connected to terminal $T_H$. The structure of FIG. 4a can then be used to embody diodes $D_H$ and $D_S$ but not diode $D_L$. The structure of FIG. 4b can again be used to embody all of diodes $D_L$, $D_H$, and $D_S$. Considering both the situation actually shown in FIGS. 4a and 4b and the situation with the conductivities reversed, the result is that at least one of diodes $D_L$ and $D_H$ noramlly must be implemented with the structure of FIG. 4b.

Figure 1:
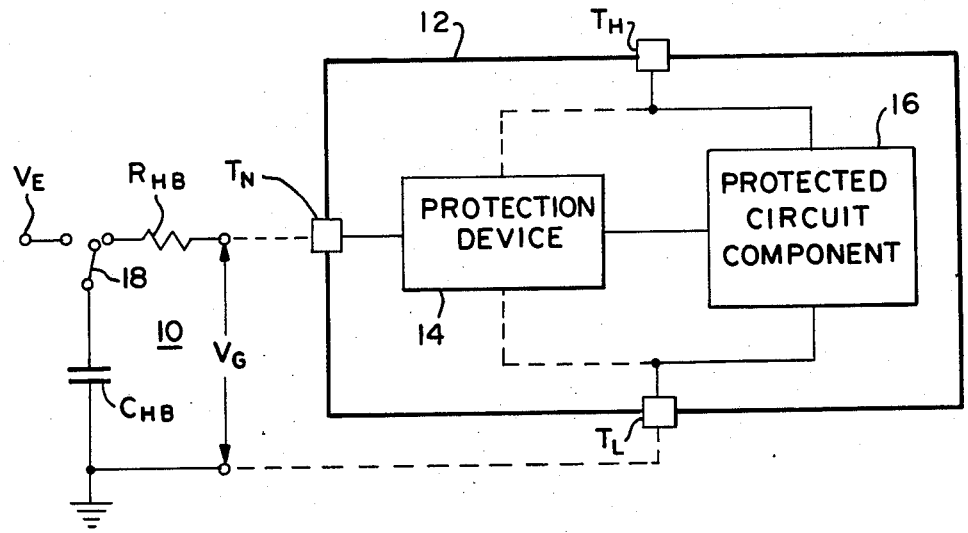
FIG. 1 is a circuit/block diagram illustrating how an IC having a protection device interacts with a circuit that models ESD produced by the human body.
Figure 2:
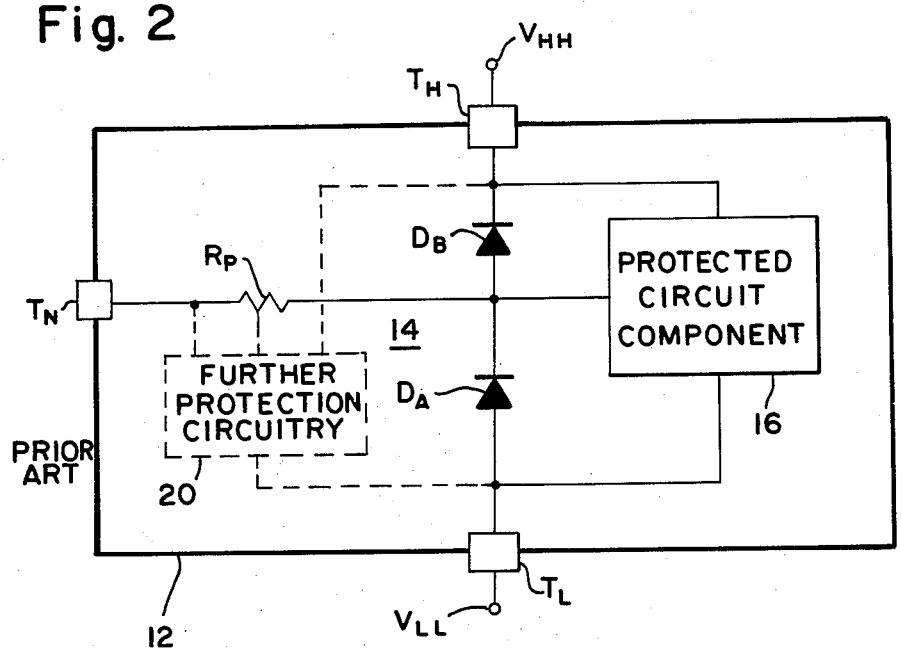
FIG. 2 is a circuit/block diagram of an IC employing a prior art protection device.

When IC 12 is subjected to ESD (or some other high-voltage phenomenon), the electrical energy discharges through IC 12 by way of its terminals. In the simplest case, the resultant ESD voltage pulse appears between two of the IC terminals. FIG. 1 is exemplary.

Figure 5A:
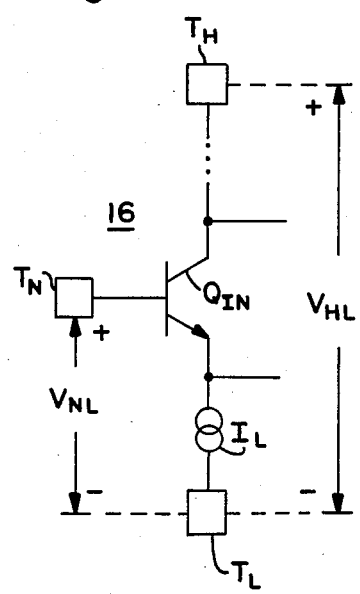
FIGS. 5a and 5b are circuit diagrams of typical elements protected by the device of FIG. 3.
Figure 5B:
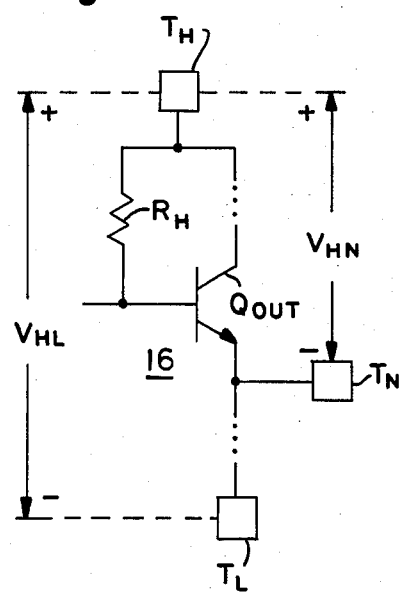

A high-magnitude voltage—i.e., a high positive voltage or a high negative voltage—applied between the two terminals is usually more damaging in one direction than the other. This can be understood with reference to FIGS. 5a and 5b which respectively show typical input and output sections for component 16. In FIG. 5a, terminal $T_N$ is an input pin coupled through the base-emitter junction of an NPN transsistor $Q_{IN}$ to terminal $T_L$. If the voltage $V_{NL}$ at terminal $T_N$ relative to that at terminal $T_L$ goes to a high positive value, the $Q_{IN}$ base-emitter junction becomes highly conductive. Transistor $Q_{IN}$ is, however, usually not harmed. Conversely, the $Q_{IN}$ base-emitter junction breaks down if voltage $V_{NL}$ reaches a high negative value. Silicon melting may occur at the junction. Similarly in FIG. 5b where terminal $T_N$ is an output pin coupled through an NPN transistor $Q_{OUT}$ to terminal $T_H$, a high negative value of the voltage $V_{HN}$ at terminal $T_H$ relative to that at terminal $T_N$ is much more damaging to transsitor $Q_{OUT}$ than a high positive value.

With the foregoing in mind, protection device 14 of FIG. 3 operates in the following way. Semiconductor diodes $D_L$, $D_H$, and $D_S$ are normally off regardless of whether IC 12 is powered or not. Assume that IC 12 is unpowered. Also, assume that resistors $R_A$ and $R_B$ are absent to simplify the discussion. Note that imposition of a voltage across diode $D_L$, $D_H$, and $D_S$ that causes it to break down and conduct current in the reverse bias direction is not inherently destructive to the diode.

In each of the cases discussed below, a voltage (such as voltage $V_G$ in FIG. 1) capable of reaching a dmaging level in the absence of device 14 is applied between two of terminals $T_L$, $T_H$, and $T_N$ with one of the two terminals being held at ground reference. The applied voltage is assumed to be positive relative to ground.

If the positive voltage is applied between terminals $T_L$ and $T_N$ with terminal $T_N$ at ground, voltage $V_{NL}$ starts moving toward a high negative value. Diode $D_L$ turns on in the forward direction when $V_{NL}$ reaches $-V_T$ (about $-1$ volt) to open a primary conductive path from terminal $T_L$ to terminal $T_N$. ESD current discharges through the path so as to prevent $V_{NL}$ from reaching a damaging negative value. If terminal $T_N$ is an input pin, this protects the $Q_{IN}$ base-emitter in FIG. 5a.

During the same time, terminal $T_H$ is usually open or shorted to one of terminals $T_L$ and $T_N$. If terminal $T_H$ is shorted to terminal $T_N$, diode $D_H$ remains off. The voltage $V_{HL}$ at terminal $T_H$ relative to that at terminal $T_L$ begins to move towards a high negative value. Diode $D_S$ turns on in the forward direction when $V_{HL}$ reaches $-V_T$ to open another primary conductive path for discharging more of the ESD current. $V_{HL}$ is similarly inhibited from dropping to a damaging negative level. If terminal $T_H$ is shorted to terminal $T_L$, diode $D_S$ remains off. $V_{HN}$ starts moving towards a high positive value. When $V_{HN}$ reaches $V_{BD}$ (typically 10 volts), diode $D_H$ breaks down and turns on in the reverse direction to open a secondary conductive path between terminals $T_H$ and $T_N$ for discharging ESD current. If terminal $T_H$ is open so that its voltage "floats", diodes $D_S$ and $D_H$ work together. When $V_{NL}$ reaches $-(V_T+V_{BD})$, diode $D_S$ turns on in the forward direction while diode $D_H$ turns on in the reverse direction. This opens aa secondary ESD discharge path through diodes $D_S$ and $D_H$. If terminal $T_N$ is an output pin in the last two situations, the base-emitter junction of transistor $Q_{OUT}$ in FIG. 5b may turn on (through resistor $R_H$) to help discharge ESD current through transistor $Q_{OUT}$ in a non-destructive manner.

Similar events occur if the positive voltage appears between terminals $T_N$ and $T_H$ with terminal $T_H$ at ground. Diode $D_H$ operates in the manner described above for diode $D_{LS}$, and vice versa. The resulting action protects the $Q_{OUT}$ base-emitter junction in FIG. 5b when terminal $T_N$ is an output pin.

The positive voltage may appear between terminals $T_L$ and $T_H$ with terminal $T_N$ open. If terminal $T_H$ is grounded, diode $D_S$ again turns on in the forward direction when $V_{HL}$ reaches $-V_T$ to open a primary ESD discharge path. Should $V_{HL}$ drop further to $-2V_T$, diodes $D_H$ and $D_L$ both turn on in the forward direction to open another primary conductive path between terminals $T_L$ and $T_H$ for discharging ESD current. If terminal $T_L$ is at ground, the same events occur in the reverse conductive directions when $V_{HL}$ reaches $V_{BD}$ and then $2V_{BD}$.

The remaining cases are treated briefly here since the events that transpire should be evident from what has been said already. If the high voltage is applied between terminals $T_L$ and $T_N$ with terminal $T_L$ grounded, diode $D_L$ turns on in the reverse direction. The same thing occurs with diode $D_H$ if the high voltage appears between terminals $T_H$ and $T_N$ with terminal $T_N$ at ground.

The foregoing discussion indicates that transistors connected like transistor $Q_{IN}$ in FIG. 5a are primarily protected by diode $D_L$. Diode $D_H$ provides secondary protection for transistor $Q_{IN}$. Didoe $D_H$ may, however, protect other input elements in component 16. With the roles of diodes $D_L$ and $D_H$ reversed, like remarks apply to transistors connected like transistor $Q_{OUT}$ in FIG. 5b and to other output elements in component 16. In short, diodes $D_L$ and $D_H$ function to prevent a voltage applied between any two of terminals $T_N$, $T_L$, and $T_H$ from reaching a level capable of damaging component 16.

Because diodes $D_L$ and $D_H$ usually have primary and secondary protective roles, one or the other can sometimes be omitted depending on whether terminal $T_N$ is an input pin or an output pin. This may be necessitated by area limitations and/or electrical restrictions.

Device 14 of FIG. 3 operates in substantially the same way when IC 12 is powered. The fact that an external power supply attempts to impress voltages $V_{HH}$ and $V_{LL}$ on terminals $T_H$ and $T_L$ does not significantly affect the operation of diodes $D_L$, $D_H$, and $D_S$.

Resistors $R_A$ and $R_B$ (if present) cooperate with diodes $D_L$ and $D_H$ but do not significantly influence their operation. Resiston $R_A$ basically limits the peak current to diodes $D_L$ and $D_H$, thereby improving their effectiveness. Resistor $R_B$ (in combination with resistor $R_A$) limits the peak current to component 16 so as to further protect it.

Figure 6:
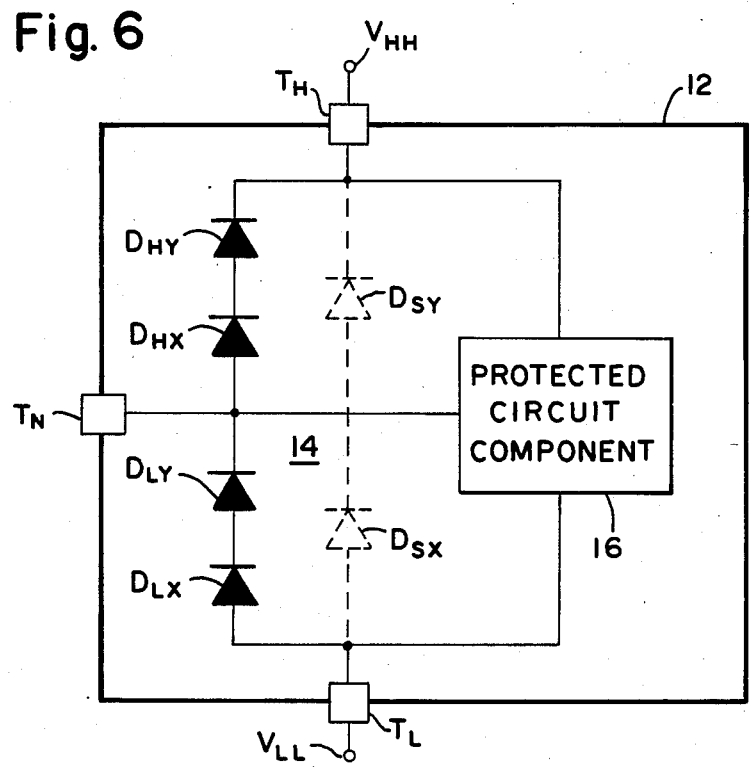
FIG. 6 is a circuit/block diagram of a variation of the IC of FIG. 3 in which the protection device utilizes further subsurfaces dioides in series.

A breakdown voltage greater than that readily attainable with one of the present subsurface diodes may be desirable in some applications. Such an application can be handles by replacing the diode with a set of subsurface semiconductor diodes connected in series. FIG. 6 shows an example of this substitution in which subsurface diodes $D_{LX}$ and $D_{LY}$ replace diode $D_L$, subsurface diodes $D_{HX}$ and $D_{HY}$ replace diode $D_H$, and subsurface diodes $D_{SX}$ and $D_{SY}$ replce diode $D_S$. Each of diodes $D_{LX}$, $D_{LY}$, $D_{HX}$, $D_{HY}$, $D_{SX}$, and $D_{SY}$ in protection device 14 of FIG. 6 can be implemented with the structure of FIG. 4b. If substrate 24 is tied directly to terminal $T_L$, only diodes $D_{LX}$ and $D_{SX}$ can be embodied with the structure of FIG. 4a. Device 14 in FIG. 6 operates in the way described above for FIG. 3 except that the critical switching voltages are doubled.

Figure 7:
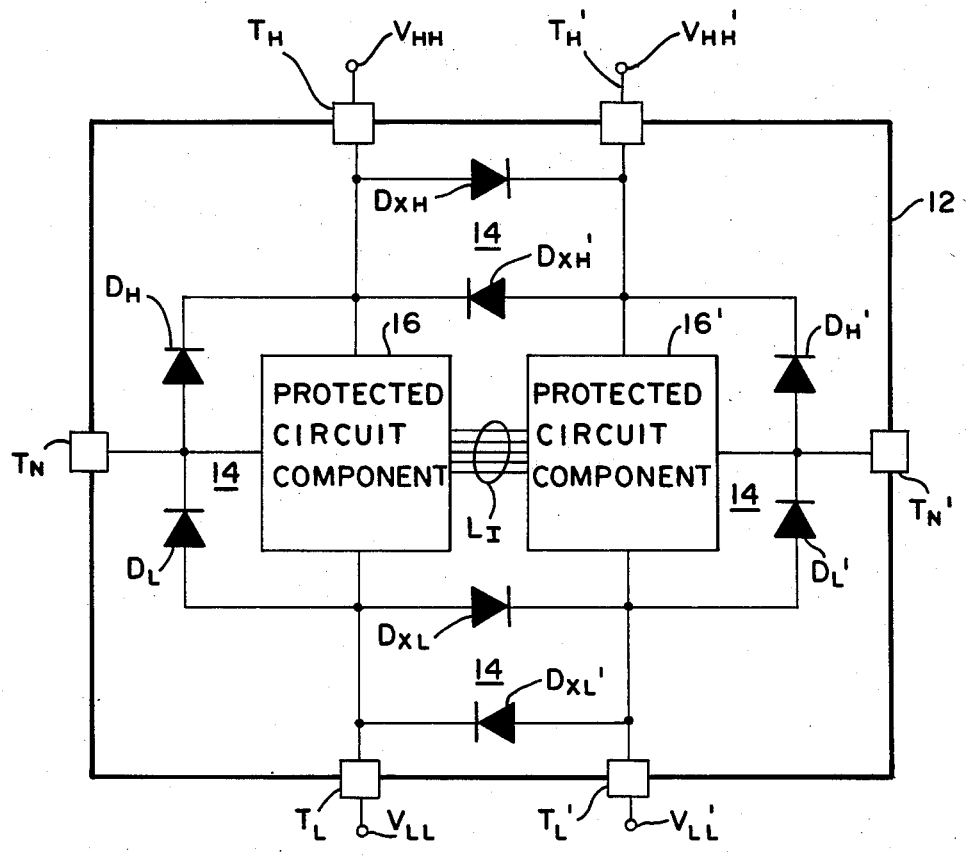
FIG. 7 is a circuit/block diagram of an IC having separately powered circuit components that are protected by the device of the invention.

IC 12 is sometimes divided into one circuit portion, typically an analog circuit, powered through one pair of supply terminals and another circuit portion, typically a digital circuit, powered through another pair of supply terminals. This situation is shown in FIG. 7 in which circuit components 16 and 16' interconnected by lines $L_I$ are the two separately powered circuit portions. For component 16', IC 12 contains a supply terminal $T_{LL}'$ for receiving a low supply voltage $V_{LL}'$ equal to $V_{LL}$, a supply terminal $T_{HH}$ for receiving a high supply voltage $V_{HH}'$ equal to $V_{HH}$ and thus greater than $V_{LL}'$, and an information terminal $T_N'$. Device 14 includes semiconductor diodes $D_L'$ and $D_H'$ that protect component 16' in the same way that diodes $D_L$ and $D_H$ protect component 16. Diodes $D_L'$ and $D_H'$ are likewise subsurface diodes implemented as shown in FIGS. 4a and 4b.

Protection device 14 is FIG. 7 further includes a pair of cross-supply semiconductor diodes $D_{XL}$ and $D_{XL}'$ connected in opposite directions between terminals $T_L$ and $T_L'$. Another pair of cross-supply semiconductor diodes $D_{XH}$ and $D_{XH}'$ are connected in opposite directions between terminals $T_H$ and $T_H'$. Diodes $D_{XL}$, $D_{XL}'$, $D_{XH}$, and $D_{XH}'$ are subsurface diodes as described above. They operate according to the foregoing mechanisms to protect components 16 and 16' from being damaged by a voltage applied between one of terminals $T_N$, $T_L$, and $T_H$ and one of terminals $T_N'$, $T_L'$, and $T_H'$.

Figure 8:
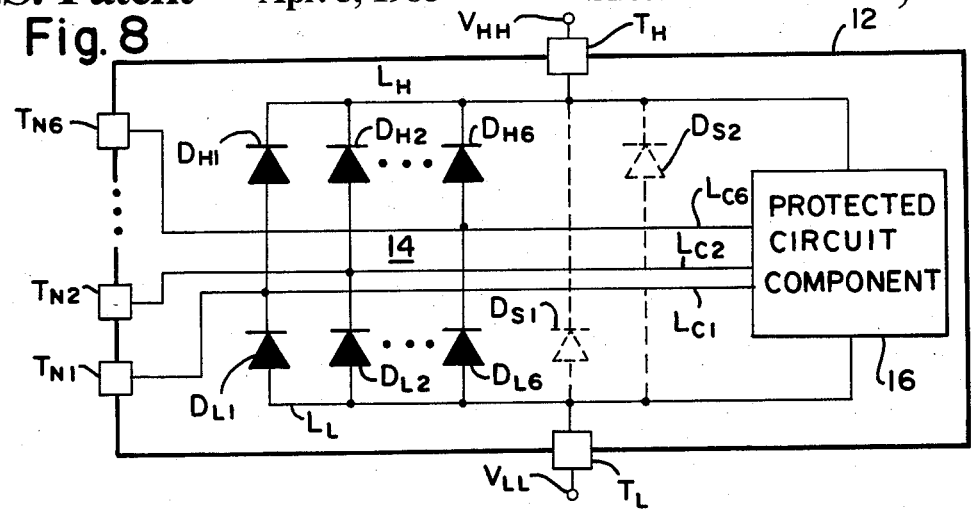
FIG. 8 is a circuit/block diagram of an expanded IC utilizing a protection device according to the invention.

FIG. 8 depicts an expanded version of IC 12 in which it has six $T_N$ information terminals labeled as $T_{N1}$, $T_{N2}$, ... $T_{N6}$. Letting i be a running integer, each information terminal $T_{Ni}$ is connected by way of a line $L_{Ci}$ to component 16. For each terminal $T_{Ni}$, device 14 in FIG. 8 contains a separate pair of subsurface diodes $D_{Li}$ and $D_{Hi}$ arranged respectively the same as diodes $D_L$ and $D_H$ in FIG. 3. A line $L_L$ connects terminal $T_L$ to the anodes of diodes $D_{L1}$, $D_{L2}$, ... $D_{L6}$. A line $L_H$ connects terminal $T_H$ to the cathodes of diodes $D_{H1}$, $D_{H2}$, ... $D_{H6}$. FIG. 8 shows two optional subsurface shunt diodes $D_{S1}$ and $D_{S2}$ corresponding to diode $D_S$.

Diodes $D_{L1}$-$D_{L6}$ and $D_{H1}$-$D_{H6}$ operate according to the above mechanisms to inhibit a voltage applied between any two of terminals $T_{N1}$-$T_{N6}$ from reaching a level that could harm component 16. One example should make the operation clear. The "worst case" occurs when terminals $T_L$ and $T_H$ are open. If a potentially damaging voltage is applied between terminals $T_{N1}$ and $T_{N2}$, two conductive paths open between terminals $T_{N1}$ and $T_{N2}$ to dissipate ESD current when the voltage magnitude reaches $V_{BD}+V_T$. One of the paths is through diodes $D_{L1}$ and $D_{L2}$, one of which turns on in the forward direction while the other turns on in the reverse direction. The other path is through diodes $D_{H1}$ and $D_{H2}$ which operate in the same way.

Figure 9:
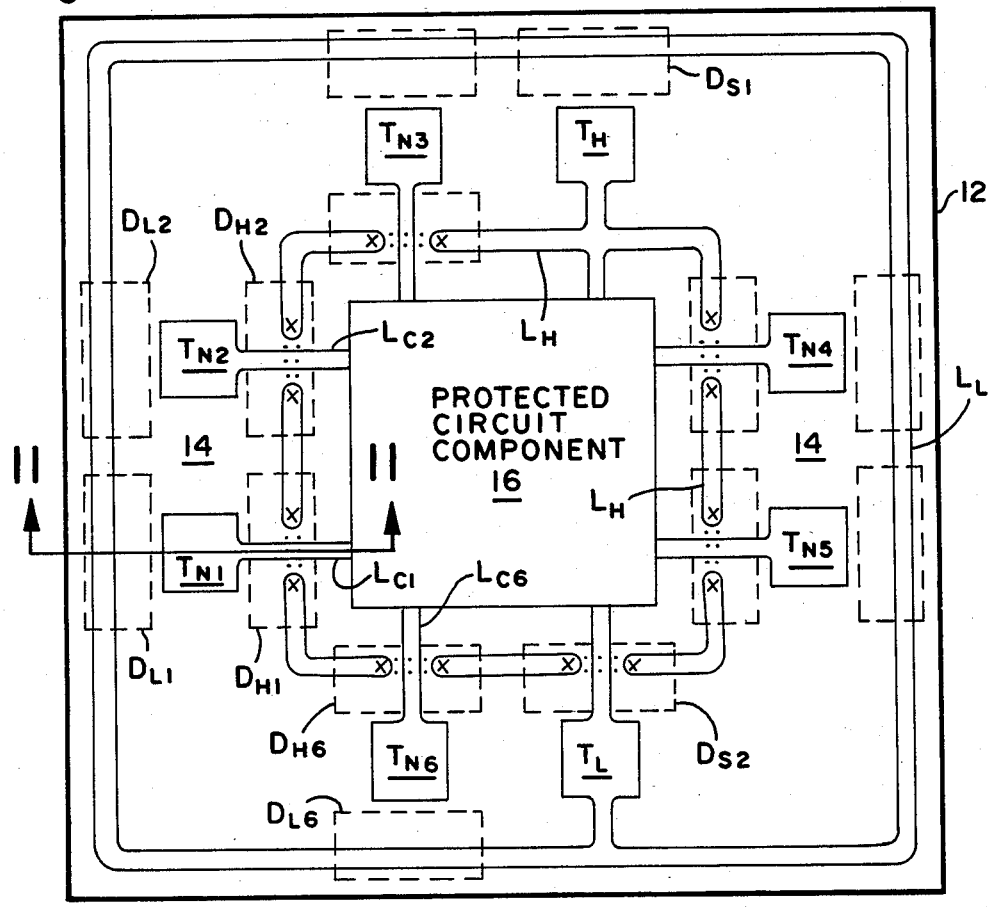
FIG. 9 is a layout view of the IC of FIG. 8.

FIG. 9 illustrates a preferred layout for IC 12 of FIG. 8. The electrical interconnection system for IC 12 in FIG. 9 is formed with two patterned metal layers. The solid lines located between the ouer boundaries of component 16 and IC 12 indicate the upper metal. The dotted lines represent parts of the lower metal. The "X's" indicate via connections between the two metal layers. The dashed lines generally indicate the outer boundaries of the subsurface diodes in device 14. Diodes $D_{L1}$-$D_{L6}$ and $D_{S1}$ (if present) are implemented with general structure of FIG. 4a. Diodes $D_{H1}$-$D_{H6}$ and $D_{S2}$ (if present) are embodied with the general structure of FIG. 4b.

Device 14 in FIG. 9 occupies a small die area because the subsurface diodes are arranged in an efficient configuration around the periphery of IC 12. Supply line $L_L$ has a major section configured in the shape of a square ring located near the outer boundary of IC 12. Supply line $L_H$ has a major section configured in the shape of a square ring located concentrically within the $L_L$ ring near the outer boundary of component 16. Terminals $T_{N1}$-$T_{N6}$, $T_L$, and $T_H$ lie between the two rings above the semiconductor body. Each diode $D_{Li}$ lies partly below the $L_L$ ring. Each diode $D_{Hi}$ lies partly below the $L_H$ ring and is separated from diode $D_{Li}$ by material underlying terminal $T_{Ni}$.

There are several additional advantages to the ring structure of FIG. 9. The series resistance in the associated part of the interconnection system is quite low. This results in excellent pin-to-pin ESD protection independent of ring position. The design of processing masks for the ring structure is simple. The processing yield is very high. The structure is thus particularly useful as a standard IC building block.

Figure 10:
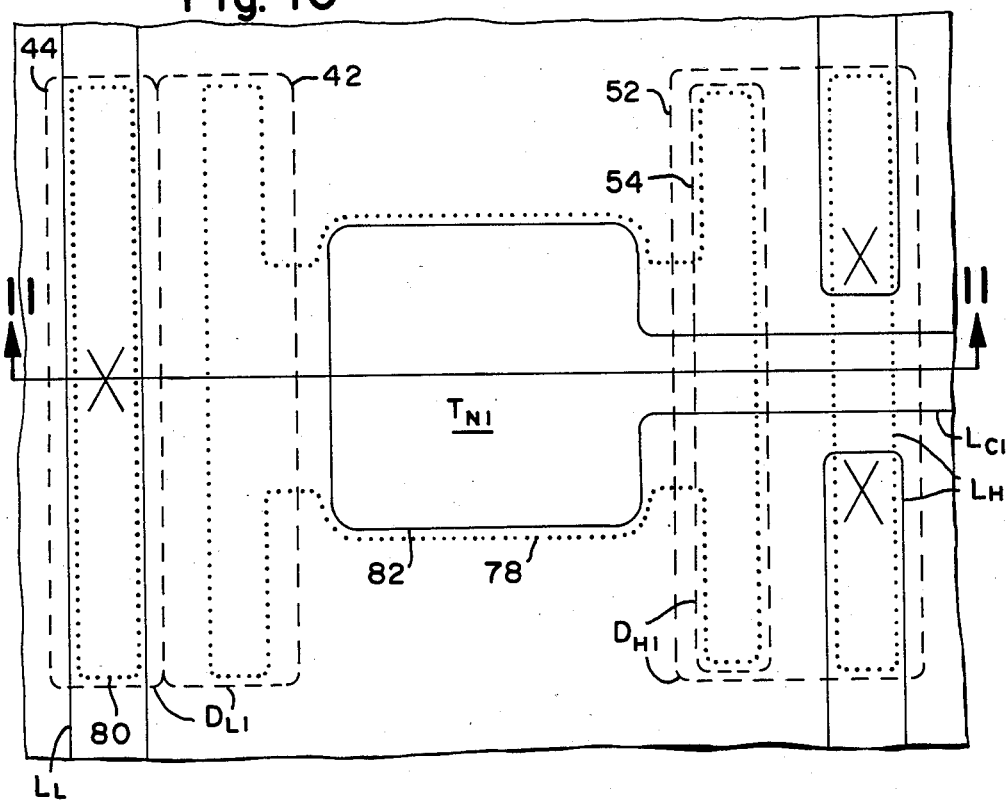
FIG. 10 is an expanded view of part of FIG. 9.
Figure 11:
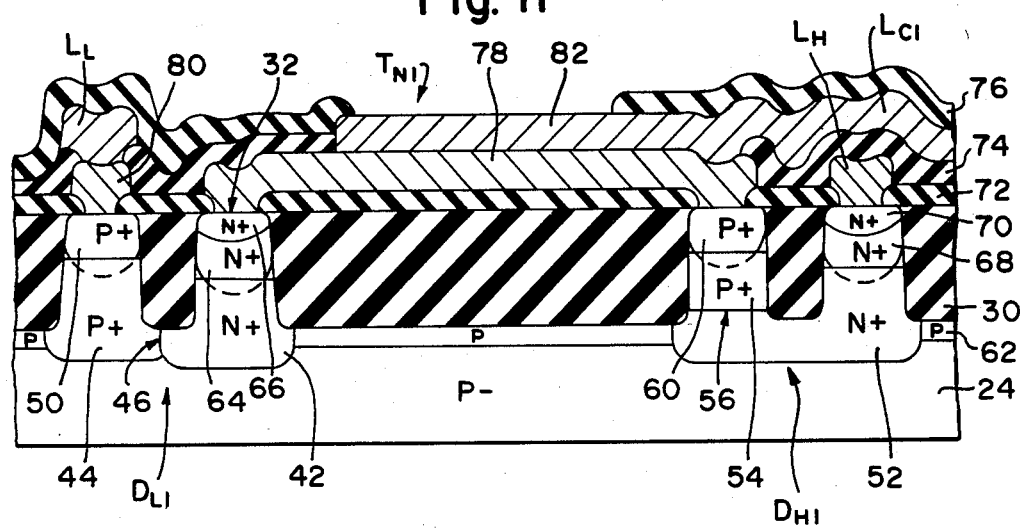
FIG. 11 is a cross-sectional side structural view taken through plane 11—11 in FIGS. 9 and 10.

FIG. 10 shows a view of a portion of the layout of FIG. 9 centering around elements $T_{N1}$, $D_{L1}$, and $D_{H1}$. FIG. 11 shows a cross section taken through plane 11—11 in FIGS. 9 and 10. An optional P-type channel-stop layer 62 underlies isolation mechanism 30 at the top of substrate 24. See FIG. 11. Mechanism 30 consists of silicon dioxide. N+ connection region 48 of FIG. 4a is formed with deep and shallow N+ regions 64 and 66 in FIG. 11. N+ connection regions 58 in FIG. 4b likewise consists of deep and shallow N+ regions 68 and 70 in FIG. 11.

The interconnection system is formed with a lower insulation layer 72, the lower metal layer, an intermediate insulation layer 74, the upper metal layer, and an upper insulation layer 76 arranged as shown in FIG. 10. Layers 72 and 74 consist mainly of silicon dioxide. Layer 76 is formed with silicon nitride or silicon dioxide. Both metal layers consist principally of an aluminum alloy. The lower metal layer is divided into line $L_H$, a lower square portion 78, and a connective portion 80 for line $L_L$. The upper metal layer is divided into lines $L_{C1}$ and $L_L$ and an upper square portion 82. Portions 78 and 82 form terminal $T_{N1}$.

FIGS. 12a–12g illustrate steps in a process for fabricating the structure of FIG. 11. Conventional cleaning and photoresist masking steps are employed in creating the various regions shown in FIGS. 11 and 12a–12g. Reference to these steps are omitted from the following description to simplify the discussion. Semiconductor dopants different from those given below could be used in certain of the steps. Some of the ion implantations could alternatively be performed by diffusion techniques. The high temperatures present at various points in the process cause implant lattice damage to be repaired and the implanted species to be achieved, in addition to causing the dopant diffusions particularly described below.

The starting point is substrate 24 as indicated in FIG. 11a. Substrate 24 has a resistivity of 2–20 ohm-cm.

Antimony is selectively implanted into substrate 24 through its upper surface 28 to form separate heavily doped N-type regions 82 and 84. See FIG. 12b. The antimony implantation is performed with (a dose of) $2\times10^{15}$ ions/cm$^2$ of Sb+ at (an energy of) 50 kiloelectron volts (keV).

Figure 12A:
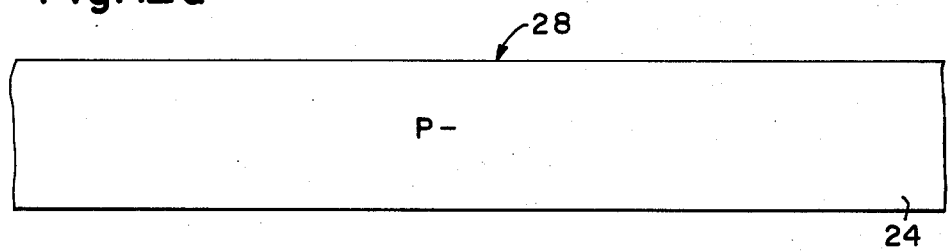
FIGS. 12a, 12b, 12c, 12d, 12e, 12f, and 12g are cross-sectional side structural views representing steps in a manufacturing process leading to the structure of FIG. 11.
Figure 12B:
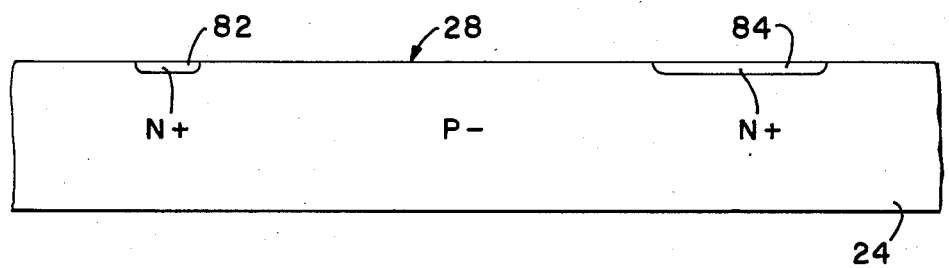
Figure 12C:
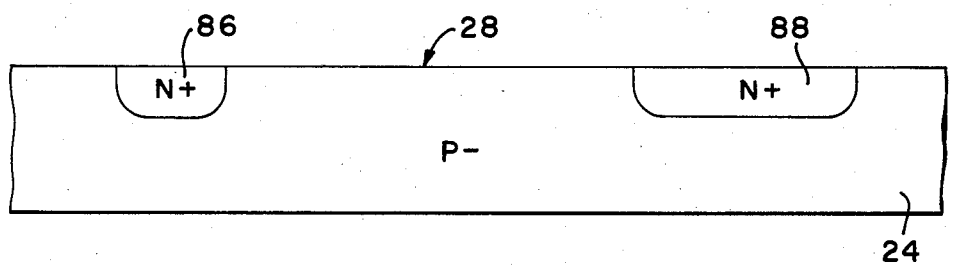

Substrate 24 is annealed in a non-oxidizing environment for at least 60 minutes at 1100° C. or more. This causes the antimony in implanted regions 82 and 84 to diffuse much further into substrate 24 to form respective N-type buried portions 86 and 88 along surface 28 as shown in FIG. 12c. The anneal is preferably done for 75 minutes at 1200° C.

Figure 12D:
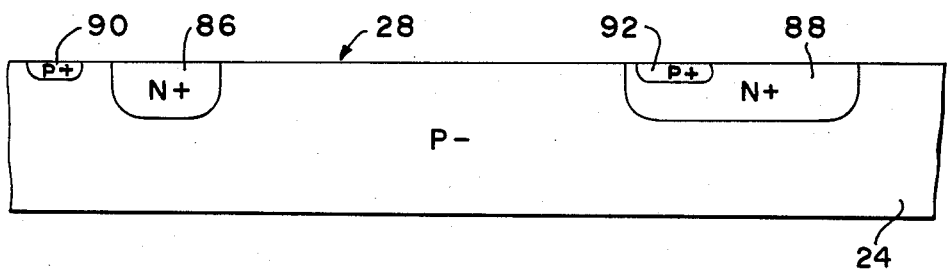
Figure 12E:
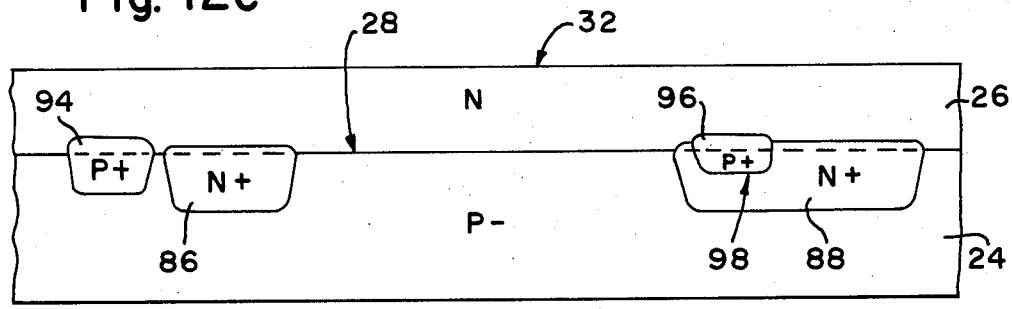
Figure 12F:
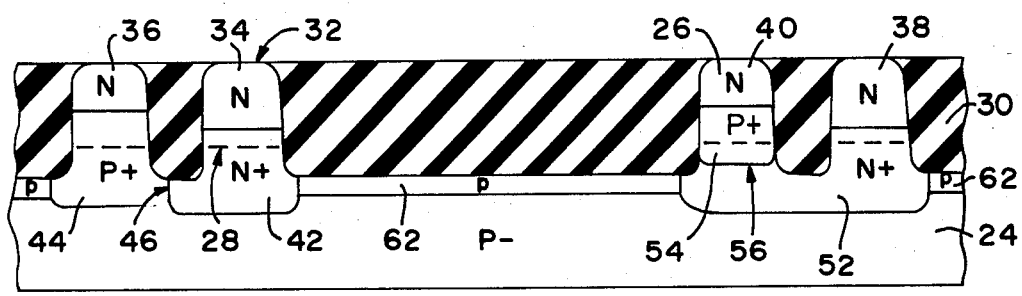

Boron is now selectively implanted through surface 28 into substrate 24 to form separate heavily doped P-type regions 90 and 92 as depicted in FIG. 12d. P+ region 90 lies close to (and may abut or partially overlap) N+ portion 86. P+ region 92 is partially or fully surrounded by N+ portion 88 up to surface 28. FIG. 12d shows the latter example. The boron implantation is done with $2\times10^{14}$ ions/cm$^2$ of B+ at 180 keV.

N epitaxial layer 26 having a resistivity of 0.3–1.0 ohm-cm is grown to a thickness of about 1.5 microns on surface 28. See FIG. 12e. The epitaxial growth is performed for 6 minutes at 1030° C. During the epitaxial growth, N+ portions 86 and 88 expand slightly as the implanted antimony diffuses further into substrate 24 and upward into epitaxial layer 26. The boron implanted into regions 90 and 92 diffuses much further into the silicon in the manner indicated in FIG. 12e to form respective P-type portions 94 and 96 along interface 28. The resulting PN junction between portions 88 and 96 is labelled as item 98.

A groove is etched into layer 26 at the general location for dielectric isolation mechanism 30 after which a channel-stop implant of boron is performed into the silicon at the bottom of the groove. Parts of layer 26 above the groove and thin underlying parts of substrate 24 are thermally oxidized to create isolation mechanism 30 and active portions 34, 36, 38, and 40.

During the oxidation, the implanted species in buried portions 86, 88, 94, and 96 diffuse further into substrate 24 and layer 26. The implanted boron diffuses considerably more than the implanted antimony. Portions 86, 94, 88, and 96 are thereby respectively converted into buried regions 42, 44, 52, and 54 to define PN junctions 46 and 56. In addition, the implanted channel-stop boron moves slightly ahead of the advancing silicon dioxide to create P region 62 at a sheet resistance of 2,000 ohms/square.

Figure 12G:
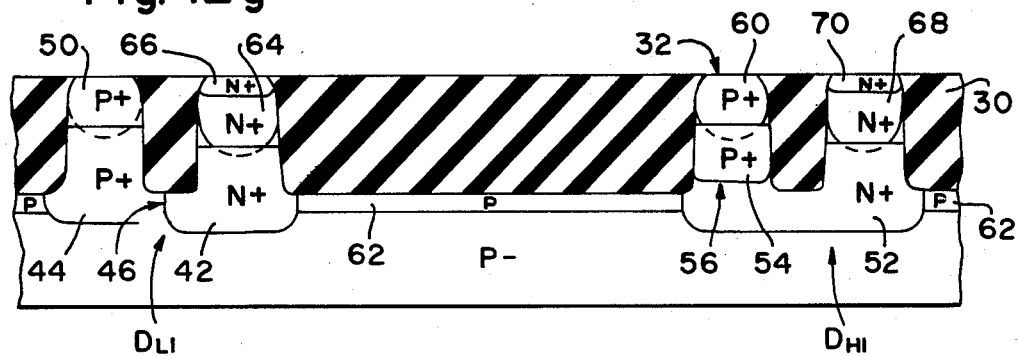

N+ regions 64 and 68, P+ regions 50 and 60, and N+ regions 66 and 70 are created by implanting phosphorus into active portions 34 and 38, annealing for 60 minutes at 1000° C., implanting boron into active portions 36 and 40, annealing for 30 minutes at 800° C., implanting arsenic into portions 34 and 38, and annealing for 30 minutes at 1000° C. The phosphorus implant for regions 64 and 68 is done with $3 \times 10^{15}$ ions/cm$^2$ of P+ at 180 keV. The boron implantation for regions 50 and 60 is performed with $1 \times 10^{15}$ ions/cm$^2$ of B+ at 90 keV. The arsenic implantation for regions 66 and 70 is done with $1 \times 10^{16}$ ions/cm$^2$ of As+ at 50 keV. All of the anneals are performed in non-oxidizing environments. FIG. 12g shows the resulting structure.

The interconnection system is now fabricated according to conventional deposition and etching steps to produce the structure of FIG. 11. This completes the basic die manufacturing process.

While the invention has been described with reference to particular embodiments, this description is solely for the purpose of illustration and is not to be construed as limiting the scope of the invention claimed below. For example, the invention applies to MOS IC's as well as bipolar IC's. The isolation mechanism might be formed with a shell of dielectric material adjoining the material of the semiconductor body. Some other material, typically polycrystalline silicon, would fill the shell. Each of the rings in the preferred layout might have a break. The relative locations of the rings could be reversed. Thus, various modifications, changes, and applications may be made by those skilled in the art without departing from the true scope and spirit of the invention as defined by the appended claims.

We claim:

1. A protection device for an integrated circuit that comprises a first supply terminal for receiving a first supply voltage, a second supply terminal for receiving a second supply voltage greater than the first supply voltage, a protected circuit component coupled to the supply terminals and formed from part of a semiconductor body having an upper surface along which electronic elements of the component are located, and an information terminal coupled to the component for transferring information between it and the external environment; the protection device comprising first and second diodes formed from part of the body, the first diode having an anode and a cathode respectively coupled to the first supply terminal and the information terminal, the second diode having an anode and a cathode respectively coupled to the information terminal and the second supply terminal, characterized in that:

a dielectric isolation mechanism recessed into the body below the upper surface laterally separates a group of active semiconductor portions of the body from one another along the upper surface; and the anode and the cathode of each diode respectively comprise a P-type zone and an N-type zone that extend from the upper surface down respectively into a pair of the active portions to form a PN junction that lies entirely below the upper surface, at least one of the zones for each diode extending vertically through the active portion for that zone and into material of the body below the isolation mechanism.

2. A device as in claim 1 characterized in that the entire perimeter of at least one of the PN junctions adjoins the isolation mechanism.

3. A device as in claim 1 characterized in that each zone comprises (a) a buried region lying below the upper surface and (b) a connection region extending from the upper surface into the active portion for that zone down to its buried region, the buried region for each diode meeting to form its PN junction.

4. A device as in claim 3 characterized in that material which is more lightly doped than the buried regions and which is of a selected conductivity type adjoins the lower surfaces of both buried regions for a specified one of the diodes.

5. A device as in claim 4 characterized in that the specified diode is the first diode, the selected conductivity type being P type.

6. A device as in claim 3 characterized in that material of a selected conductivity type surrounds one of the buried regions for a specified one of the diodes up to the isolation mechanism, that buried region being of opposite conductivity type to the selected conductivity type.

7. A device as in claim 6 characterized in that the specified diode is the second diode, the selected conductivity type being P type.

8. A device as in claim 6 characterized in that material which is more lightly doped than the buried regions and which is of the selected conductivity type adjoins the lower surfaces of both buried regions for the remaining diode.

9. A device as in claim 8 characterized in that the specified and remaining diodes respectively are the second and first diodes, the selected conductivity type being P type.

10. A device as in claim 1 characterized in that the protection device includes a shunt diode having an anode and a cathode respectively coupled to the first and second supply terminals, the anode and cathode of the shunt diode respectively comprising a P-type zone and an N-type zone that extend from the upper surface down respectively into a pair of the active portions to form a PN junction that lies entirely below the upper surface, at least one of the zones of the shunt diode extending vertically through the active portion for that zone and into material of the body below the isolation mechanism.

11. A device as in claim 1 characterized in that:

the circuit includes a further first supply terminal for receiving a further first supply voltage, a further second supply terminal for receiving a further second supply voltage greater than the further first supply voltage, a further protected circuit component coupled to the further supply terminals and formed from part of the body, and a further information terminal coupled to the further component for transferring information between it and the external environment; and the protection device includes further first and second diodes formed from part of the body, the further first diode having an anode and a cathode respectively coupled to the further first supply terminal and the further information terminal, the further second diode having an anode and a cathode respectively coupled to the further information terminal and the further second supply terminal.

12. A device as in claim 11 characterized in that the anode and cathode of each further diode respectively comprise a P-type zone and an N-type zone that extend from the upper surface into a pair of the active portions to form a PN junction that lies entirely below the upper surface, at least one of the zones for each further diode extending vertically through the active portion for that zone and into material of the body below the isolation mechanism.

13. A device as in claim 12 characterized in that the protection device includes:
a pair of cross-supply diodes coupled in parallel in opposite directions between the first supply terminals; and
a pair of cross-supply diodes coupled in parallel in opposite directions between the second supply terminals.

14. A device as in claim 13 characterized in that the anode and cathode of each cross-supply diode respectively comprise a P-type zone and an N-type zone that extend from the upper surface into a pair of the active portions to form a PN junction that lies entirely below the upper surface, at least one of the zones for each cross-supply diode extending vertically through the active portion for that zone and into material of the body below the isolation mechanism.

15. A device as in claim 1 in which the circuit includes at least one additional information terminal coupled to the component for transferring information between it and the external environment; the protection device comprising, for each additional information terminal, a corresponding pair of additional first diode having an anode and a cathode respectively coupled to the first supply terminal and the corresponding additional information terminal, each additional second diode having an anode and a cathode respectively coupled to the corresponding information terminal and the second supply terminal, characterized in that the anode and cathode of each additional diode respectively comprise a P-type zone and an N-type zone that extend from the upper surface into a pair of the active portions to form a PN junction that lies entirely below the upper surface, at least one of the zones for each additional diode extending vertically through the active portion for that zone and into material of the body below the isolation mechanism.

16. A device as in claim 15 characterized in that:
the first supply terminal is connected to a first supply line having a first ring-shaped section;
the second supply terminal is connect to a second supply line having a second ring-shaped section of largely the same proportions as, but different size than, the first section, the two sections located concentrically above the body so that one lies within the other;
the information terminals lie between the two sections above the body;
each first diode lies partly below the first section; and
each second diode lies partly below the second section separated from the corresponding first diode by material underlying the information terminal for those two diodes.

17. A protection device for an integrated circuit that has a first supply terminal for receiving a first supply voltage, a second supply terminal for receiving a second supply voltage greater than the first supply voltage, a protected circuit component coupled to the supply terminals and formed from part of a semiconductor body having an upper surface along which electronic elements of the component are located, and an information terminal coupled to the component for transferring information between it and the external environment; the device comprising a diode formed from part of the body, the diode either having an anode and a cathode respectively coupled to the first supply terminal and the information terminal or having an anode and a cathode respectively coupled to the information terminal and the second supply terminal, characterized in that:
an isolation mechanism recessed into the body below the upper surface laterally separates a group of active semiconductor portions of the body from one another along the upper surface, the isolation mechanism substantially consisting of dielectric material at least where the isolation mechanism adjoins material of the body; and
the anode and the cathode respectively comprise a P-type zone and an N-type zone that extend from the upper surface down respectively into a pair of the active portions to form a PN junction that lies entirely below the upper surface, at least one of the zones extending vertically through the active portion for that zone and into material of the body below the isolation mechanism.

18. A device as in claim 17 characterized in that the entire perimeter of the PN junction adjoins the isolation mechanism.

19. A method of fabricating a protection device for an integrated circuit that comprises a first supply terminal for receiving a first supply voltage, a second supply terminal for receiving a second supply voltage greater than the first supply voltage, a protected circuit component coupled to the supply terminals, and an information terminal coupled to the component for transferring information between it and the external environment; the protection device comprising first and second diodes, the first diode having an anode and a cathode respectively coupled to the first supply terminal and the information terminal, the second diode having an anode and a cathode respectively coupled to the information terminal and the second supply terminal, characterized by the steps of:
introducing (a) N-type dopant into a semiconductor substrate of a selected conductivity type through its upper surface at a pair of separate locations and (b) P-type dopant into the substrate through its upper surface at a pair of separate locations;

growing an epitaxial semiconductor layer on the upper surface of the substrate to form a semiconductor body comprising the substrate and epitaxial layer;

creating a dielectric isolation mechanism that is recessed into the body below its upper surface so as to laterally separate a group of active portions of the body from one another and establishing (a) a pair of N-type connection regions that extens from the upper surface of the body respectively into a pair of the active portions and (b) a pair of P-type connection regions that extend from the upper surface of the body respectively into another pair of the active portions; and causing the preceding dopants to diffuse further into the body during at least the foregoing steps to form (a) a pair of N-type buried regions and (b) a pair of P-type buried regions that respectively meet the N-type buried regions to define a pair of separate PN junctions that lie fully below the upper surface of the body, the N-type buried regions respectively meeting the N-type connection regions to form the cathodes, the P-type buried regions respectively meeting the P-type connection regions to form the anodes.

20. A method as in claim 19 characterized in that the entire perimeter of at least one of the PN junctions adjoins the isolation mechanism.

21. A method as in claim 19 characterized in that the step of introducing the dopants sequentially comprises:
introducing the N-type dopant into the substrate;
annealing the substrate at a high temperature to cause the N-type dopant to diffuse further into the substrate; and
introducing the P-type dopant into the substrate.

22. A method of fabricating a protection device for an integrated circuit that comprises a first supply terminal for receiving a first supply voltage, a second supply terminal for receiving a second supply voltage greater than the first supply voltage, a protected circuit component coupled to the supply terminals, and an information terminal coupled to the component for transferring information between it and the external environment; the protection device comprising a diode either having an anode and a cathode respectively coupled to the first supply terminal and the information terminal or having an anode and a cathode respectively coupled to the information terminal and the second supply terminal, characterized by the steps of:

introducing N-type dopant into a part of a P-type semiconductor substrate through its upper surface;

annealing the substrate to cause the N-type dopant to diffuse further into the substrate so as to form an N-type portion along the upper surface of the substrate;

introducing P-type dopant into a part of the substrate at least partially surrounded by the N-type portion up to the upper surface of the substrate;

growing an epitaxial semiconductor layer on the upper surface of the substrate to form a semiconductor body comprising the substrate and the epitaxial layer;

creating a dielectric isolation mechanism that is recessed into the body below its upper surface so as to laterally separate a group of active portions of the body from one another and establishing an N-type connection region and a P-type connection region that extend from the upper surface respectively into a pair of the active portions; and causing the preceding dopants to diffuse further into the body during steps after the annealing step to form a heavily doped N-type buried region and a heavily doped P-type buried region that meet to define a PN junction whose entire perimeter adjoins the isolation mechanism below the upper surface of the body, the N-type regions meeting each other, the P-type regions meeting each other, the diode comprising the regions.

23. A method as in claim 22 characterized in that the N-type dopant is antimony.

24. A method as in claim 23 characterized in that the step of annealing is performed at a temperature of at least 1100° C.

25. A method as in claim 24 characterized in that the step of annealing is performed for at least 60 minutes.

26. A method as in claim 25 characterized in that the step of creating the isolation mechanism comprises oxidizing selected parts of the epitaxial layer and underlying parts of the substrate.

* * * * *

UNITED STATES PATENT AND TRADEMARK OFFICE
CERTIFICATE OF CORRECTION

PATENT NO. : 4,736,271

DATED : April 5, 1988

INVENTOR(S) : WILLIAM DOUGLAS MACK and RICHARD HENRY LANE

It is certified that error appears in the above-identified patent and that said Letters Patent is hereby corrected as shown below:

Column 13, line 51, after "first", insert -- and second diodes formed from part of the body, each additional first --.

Column 15, line 9, "extens" should be -- extend --.

Signed and Sealed this

Sixth Day of June, 1989

Attest:

Attesting Officer

DONALD J. QUIGG

Commissioner of Patents and Trademarks